US007589052B2

(12) United States Patent
Ernur et al.

(10) Patent No.: US 7,589,052 B2
(45) Date of Patent: Sep. 15, 2009

(54) SLURRY COMPOSITION AND METHOD FOR CHEMICAL MECHANICAL POLISHING OF COPPER INTEGRATED WITH TUNGSTEN BASED BARRIER METALS

(75) Inventors: Didem Ernur, Leuven (BE); Valentina Terzieva, Bertem (BE); Jörg Schuhmacher, Grez Doiceau (BE)

(73) Assignee: IMEC, Leuven (BE)

( * ) Notice: Subject to any disclaimer, the term of this patent is extended or adjusted under 35 U.S.C. 154(b) by 586 days.

(21) Appl. No.: 11/181,565

(22) Filed: Jul. 13, 2005

(65) Prior Publication Data

US 2006/0014657 A1  Jan. 19, 2006

Related U.S. Application Data

(60) Provisional application No. 60/588,247, filed on Jul. 15, 2004.

(51) Int. Cl.
    *C09G 1/02* (2006.01)
(52) U.S. Cl. .................. 510/175; 438/692; 438/693
(58) Field of Classification Search .............. 510/175; 438/692, 693
    See application file for complete search history.

(56) References Cited

U.S. PATENT DOCUMENTS

| 5,599,977 | A  | * | 2/1997 | Kiely et al. ........... 562/523 |
| 6,066,028 | A  | * | 5/2000 | Cheng et al. .......... 451/28 |
| 6,656,022 | B2 | * | 12/2003 | Ota et al. ............ 451/41 |
| 6,692,546 | B2 | * | 2/2004 | Ma et al. ............. 51/298 |
| 6,896,825 | B1 | * | 5/2005 | Uchida et al. ......... 252/79.1 |
| 6,899,821 | B2 | * | 5/2005 | Uchida et al. ......... 252/79.1 |
| 2002/0004360 | A1 | * | 1/2002 | Ota et al. ............ 451/60 |
| 2002/0182851 | A1 |   | 12/2002 | Yeh et al. |
| 2005/0211951 | A1 | * | 9/2005 | Kelley et al. ......... 252/79.1 |

FOREIGN PATENT DOCUMENTS

| EP | 1 533 352 A1 | 5/2005 |
| JP | 2004055861 A | * 2/2004 |
| WO | WO 01/83638 A1 | 11/2001 |
| WO | WO 02090025 A1 | * 11/2002 |
| WO | WO 03/015148 A1 | 2/2003 |
| WO | WO 2004/101695 A1 | 11/2004 |

OTHER PUBLICATIONS

D. Emur, *Corrosion of Copper Interconnects*, Jan. 2005, XP001206904.
Search Report for European Application EP 05447071.1, completed on Jul. 4, 2005.

* cited by examiner

*Primary Examiner*—Gregory E Webb
(74) *Attorney, Agent, or Firm*—Knobbe Martens Olson & Bear LLP

(57) ABSTRACT

The present invention is related to a slurry composition for polishing copper integrated with tungsten containing barrier layers and its use in a CMP method. The present invention is also related to a method for polishing copper integrated with tungsten containing barrier layers by means of an aqueous solution containing abrasive particles, an inorganic acid such as $HNO_3$ as etchant for copper that prevents galvanic corrosion of the tungsten containing metal barrier and at least one organic compound to provide sufficient copper corrosion inhibition.

33 Claims, 12 Drawing Sheets

SLURRY COMPOSITION AND METHOD FOR CHEMICAL MECHANICAL POLISHING OF COPPER INTEGRATED WITH TUNGSTEN BASED BARRIER METALS

CROSS-REFERENCE TO RELATED APPLICATIONS

This application claims priority under 35 U.S.C. § 119(e) to U.S. Provisional Application No. 60/588,247, filed Jul. 15, 2004. The above-referenced prior application is incorporated by reference herein in its entirety and is hereby made a portion of this specification.

FIELD OF THE INVENTION

The present invention is related to the field of semiconductor processing. More specifically, it is related to the chemical mechanical polishing (CMP) processing of copper integrated with a tungsten-based barrier layer. More specifically, it concerns a new slurry composition and a method to polish copper, and subsequently the tungsten containing barrier layer, while avoiding galvanic corrosion of tungsten and simultaneously providing sufficient copper removal without copper corrosion.

BACKGROUND OF THE INVENTION

Copper (Cu) is selected as the interconnect material of choice for the fabrication of ultra large scale integrated circuits (ULSI circuits) due to its lower resistivity and high electromigration resistance as compared to aluminum (Al). This requires the utilization of the damascene process for the fabrication of Cu interconnects. Unlike Al metallization, the damascene process relies on depositing Cu onto the patterned dielectric by electrochemical deposition (ECD). Since Cu readily diffuses into the dielectric, a diffusion barrier is deposited prior to Cu deposition.

Along with the decrease in feature sizes and the limitation of the physical vapor deposition process (PVD) for fabricating below 0.13 mm technology, the demand for effective diffusion barriers with decreasing film thickness has increased. This has necessitated the use of atomic layer deposition (ALD) for barrier metal deposition. This is because ALD provides deposition of a uniform thin layer.

In the manufacturing of microelectronic devices, Cu is susceptible to corrosion for many reasons. Even though Cu is a noble metal, it readily reacts in oxidizing environments. Corrosion of Cu interconnects during IC manufacturing is believed to occur mostly during the CMP process where Cu contacts the CMP slurry.

Chemical mechanical planarization or polishing (CMP) is used to polish the excess Cu overburden and barrier metal to provide surface planarity.

Chemical corrosion, photo-corrosion, narrow trench corrosion, and galvanic corrosion are reported to be the possible mechanisms of Cu corrosion during CMP. Galvanic corrosion (also referred to as bimetallic corrosion) occurs due to electrochemical incompatibility between two dissimilar metals that are in electrical and ionic contact. Thus, if the barrier metal is electrochemically incompatible with Cu, then galvanic corrosion takes place during the CMP process when the slurry acts as the electrolyte. It is either Cu or the barrier metal that acts as the anode, and thus suffers from enhanced etching as a result of the galvanic coupling.

Many barrier metals, such as Ta, TaN, Ti, TiN, W, and Tungsten Nitride Carbide (WNC) have been the scope of research for their potential use as diffusion barriers due to their ease of deposition, good step coverage, and good adhesion between Cu and the dielectric.

However, some are reported to be responsible for galvanic corrosion. Tungsten-containing barriers, e.g., WNC, suffer from galvanic corrosion when $H_2O_2$-containing slurries are used. This means that there will be a loss of barrier material on the top corners of the trenches at the interface of the copper and barrier layer after polishing.

Indeed, tungsten (W) etching during CMP is attributed to the oxidation and subsequent dissolution of the W-oxide complex into the slurry, leading to the formation of a complex surface film.

The oxidation occurs in two steps in many cases. $H_2O_2$ is shown to form a complicated non-stoichiometric $WO_2/WO_3$ duplex oxide, which is stated to be more soluble in the presence of $H_2O_2$ than in its absence.

The introduction of very thin barrier layers (such as ALD deposited WNC barriers) makes this problem even more critical.

It is believed that the mechanism of chemical etching of ALD (Atomic Layer Deposition) WNC barrier metal is also due to the oxidation of W in the WNC film by $H_2O_2$ in the solution. The oxidation and subsequently dissolution of W from the W-containing barrier layer is strongly enhanced because of the galvanic coupling of the W-containing barrier to the Cu layer, which gives rise to a high potential difference between the W layer and the Cu layer.

Therefore, the successful integration of W-containing barriers layers, such as WCN, in the copper metallization scheme requires the use of another oxidizer in the slurry.

SUMMARY OF THE INVENTION

It is the object of the preferred embodiments to solve the shortcomings of the commercially available polishing slurries and to provide a slurry composition which makes it possible to polish Cu structures with integrated W-containing barriers while avoiding galvanic corrosion. The integration of thin W-containing barrier layers in Cu damascene structures is thus possible.

The preferred embodiments provide a new slurry (aqueous) composition to chemical mechanical polish copper integrated with W-containing barrier layers, such that unwanted galvanic corrosion leading to dissolution of tungsten is avoided.

The preferred embodiments provide a new slurry composition for polishing of copper integrated with a W-containing barrier layer comprising $HNO_3$ and at least one corrosion inhibitor of copper.

The preferred embodiments provide a new slurry composition comprising $HNO_3$ combined with at least one organic compound, wherein the organic compound is preferably at least one sugar compound and/or at least one organic acid.

Another object relates to the use of a composition of the preferred embodiments for preventing or reducing the galvanic corrosion of the Cu and/or W-containing barrier.

The preferred embodiments also provide a method for polishing Cu structures and their integrated W-containing barrier layer, while avoiding (or reducing) galvanic corrosion of Cu and/or of the barrier, using a slurry composition of the preferred embodiments.

The preferred embodiments provide a method for chemical mechanical polishing of copper integrated with W-containing barrier layers comprising the step of contacting (or polishing) the layers with a slurry composition comprising $HNO_3$ and at least one sugar compound and/or at least one organic acid.

Also provided is a polishing method comprising the steps of substantially removing the overburden of copper by means of a $H_2O_2$ containing slurry composition, and removing the remaining copper overburden by means of a slurry composition comprising $HNO_3$ combined with at least one sugar compound and/or at least one organic acid.

The second step of removing the remaining overburden of copper is performed by means of a slurry composition according to the preferred embodiments.

The sugar compound(s) in a composition of the preferred embodiments is preferably a monosaccharide, or a mixture of monosaccharides, such as fructose, galactose, and/or glucose.

The sugar compound can also be an amino-sugar compound and/or a sugar-alcohol compound.

The sugar compound can also be a pyranoside.

In a composition according to the preferred embodiments, the sugar compound(s) concentration is preferably from about 0.5 wt. % to about 15 wt. %, based on the total weight of the composition.

In a composition of the preferred embodiments comprising galactose, the galactose concentration is preferably about 1 wt. %, based on the total weight of the composition.

In a composition of the preferred embodiments comprising fructose, the fructose concentration is preferably about 10 wt. %, based on the total weight of the composition.

The organic acid compound in a composition of the preferred embodiments can be a monocarboxylic acid or a polycarboxylic acid. Preferably the organic acid is citric acid or acetic acid, and even more preferably malic acid.

The organic acid compound can also be derived from a sugar compound, also referred to herein as a "sugar" acid. Preferred examples of these "sugar" acids include "aldonic" acid (such as from gluconic acid), "alduronic" acid (such as from glucuronic acid), and "aldaric" acid (such as from glucaric acid), which are derived from glucose. These acids exhibit an increased corrosion inhibition effect towards copper. For that reason, these sugar derivatives are even more preferred organic acid compounds.

In a composition according to the preferred embodiments, the organic acid compound(s) concentration is preferably from about 0.0001 wt. % to about 0.5 wt. % based on the total weight of the composition.

In a composition comprising oxidized sugar compound(s), the concentration of the oxidized sugar compound(s) is preferably from about 0.0001 wt. % to about 0.5 wt. %, based on the total weight of the composition.

In a composition according to the preferred embodiments, $HNO_3$ is preferably in a concentration of from about 1.5 wt. % to about 5.0 wt. %, based on the total weight of the composition.

A preferred composition of the preferred embodiments comprises $HNO_3$ in a concentration of from about 1.5 wt. % to about 5.0 wt. % and at least one sugar compound, preferably at least one monosaccharide, in a concentration of from about 0.5 wt. % to about 15 wt. %, based on the total weight of the composition.

A more preferred composition of the preferred embodiments comprises $HNO_3$ in a concentration of from about 1.5 wt. % and about 5.0 wt. %, and at least one oxidized sugar compound in a concentration of from about 0.0001 wt. % to about 0.5 wt. %, based on the total weight of the composition.

BRIEF DESCRIPTION OF THE DRAWINGS

All drawings are intended to illustrate some aspects of the preferred embodiments. Not all alternatives and options are shown and therefore the preferred embodiments are not limited to the content of the given drawings.

FIG. 1 also shows that a $HNO_3$ based solution had the lowest galvanic current value. Malic acid and citric acid in a 9 vol. % $H_2O_2$ solution showed still high galvanic current values.

FIG. 12 (a) shows the Cu damascene structure before polishing (CMP) with Cu overburden. FIG. 12 (b) illustrates the resulting structure after the first polishing step using an $H_2O_2$-containing slurry and removing more than ¾ of the Cu overburden (preferably, removing about 90% and/or leaving about 100 nm of Cu overburden). FIG. 12 (c) illustrates the resulting structure after the second polishing step using an $HNO_3$-based slurry composition of the preferred embodiments for removing the remaining overburden of Cu and WCN barrier.

In relation to the drawings, the preferred embodiments are described in detail in the following.

DETAILED DESCRIPTION OF THE PREFERRED EMBODIMENT

The following description and examples illustrate a preferred embodiment of the present invention in detail. Those of skill in the art will recognize that there are numerous variations and modifications of this invention that are encompassed by its scope. Accordingly, the description of a preferred embodiment should not be deemed to limit the scope of the present invention.

In the context of the preferred embodiments, the term "(polishing) slurry composition" means that abrasive particles are present in the aqueous composition of the preferred embodiments. The abrasive particles are, for example, metal oxide particles such as colloidal silica ($SiO_2$), alumina ($Al_2O_3$) particles, or any other known abrasive particles.

A slurry (aqueous) composition in accordance with the preferred embodiments comprises $HNO_3$ and at least one corrosion inhibitor for copper and optionally any other additive(s) to enhance the polishing of copper.

A slurry composition in accordance with the preferred embodiments comprises $HNO_3$ and at least one organic compound acting as corrosion inhibitor. The organic compound(s) is (are) preferably at least one sugar compound and/or at least one organic acid.

The $HNO_3$ acts as an oxidizing compound for Cu and gives rise to no galvanic corrosion when used to polish Cu structures with integrated W-containing barrier layers.

The $HNO_3$ replaces the oxidizer conventionally used, namely $H_2O_2$. Therefore, a composition comprising $HNO_3$ and at least one sugar compound and/or at least one organic acid, with no $H_2O_2$, is also contemplated.

The sugars or organic acids act as corrosion inhibitors for copper.

Preferred concentrations used for $HNO_3$ in combination with organic acids are from (about) 1.5 wt. % and (about) 5.0 wt. %, based on the total weight of the composition. More preferably, the $HNO_3$ concentration in combination with organic acids is (about) 3 wt. %, based on the total weight of the composition.

The preferred concentration ranges for the organic acid(s) are from (about) 0.0001 wt. % to (about) 0.5 wt. %. More preferably, the organic acid(s) concentration is (about) 0.05 wt. %, based on the total weight of the composition.

An organic acid in a composition of a preferred embodiment contains at least one carboxylic acid group.

Figure 6:
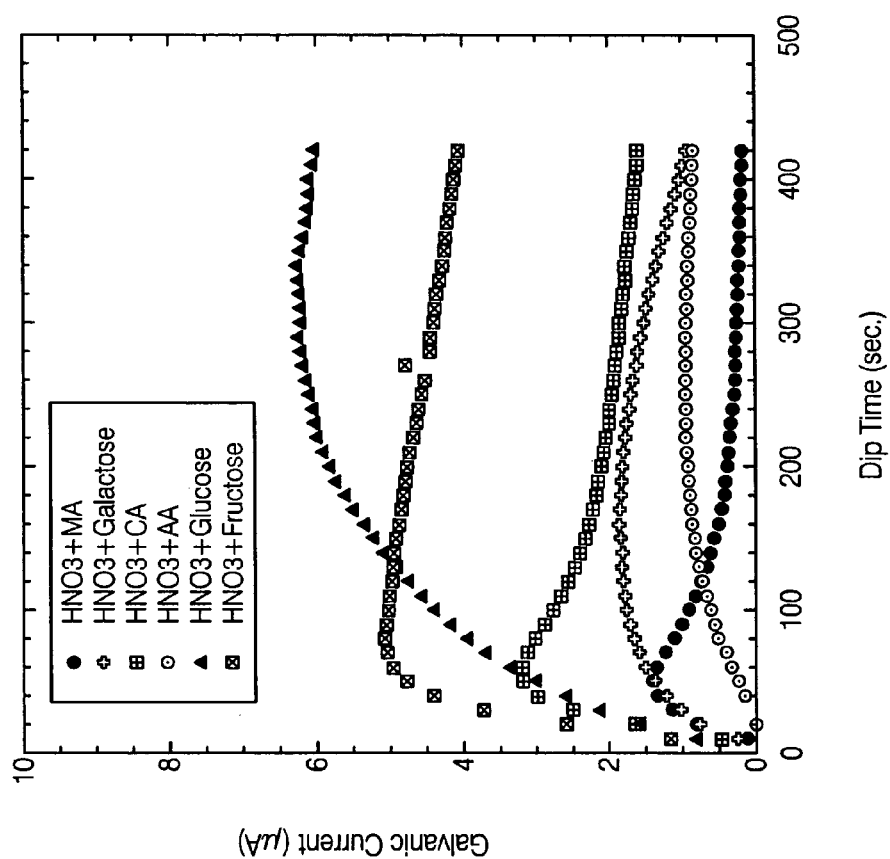
FIG. 6 shows galvanic current as a function of time by galvanic coupling of Cu—WNC using a slurry composition of the preferred embodiments comprising $HNO_3$ and in addition, respectively, Malic Acid (MA), Galactose, Citric Acid (CA), Acetic Acid (AA), Glucose, and Fructose.
Figure 10:
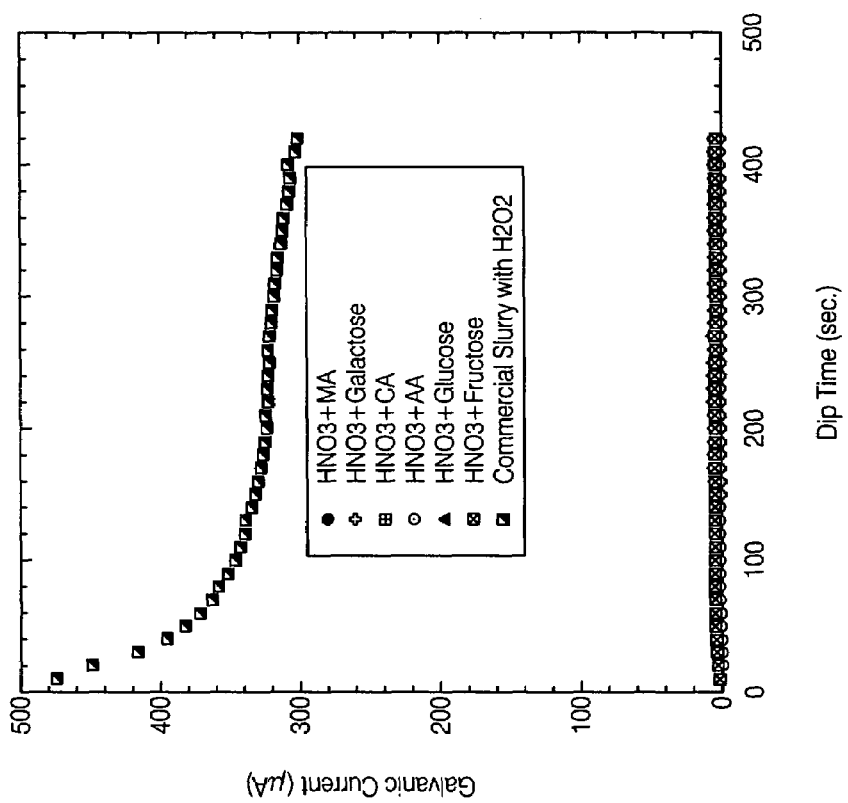
FIG. 10 shows current change as a function of time obtained after a chemical dip of Cu/WNC structures in commercially available slurries containing $H_2O_2$, and in $HNO_3$-based solutions with additions of an organic compound to inhibit copper corrosion (organic acids or monosaccharides).
Figure 11:
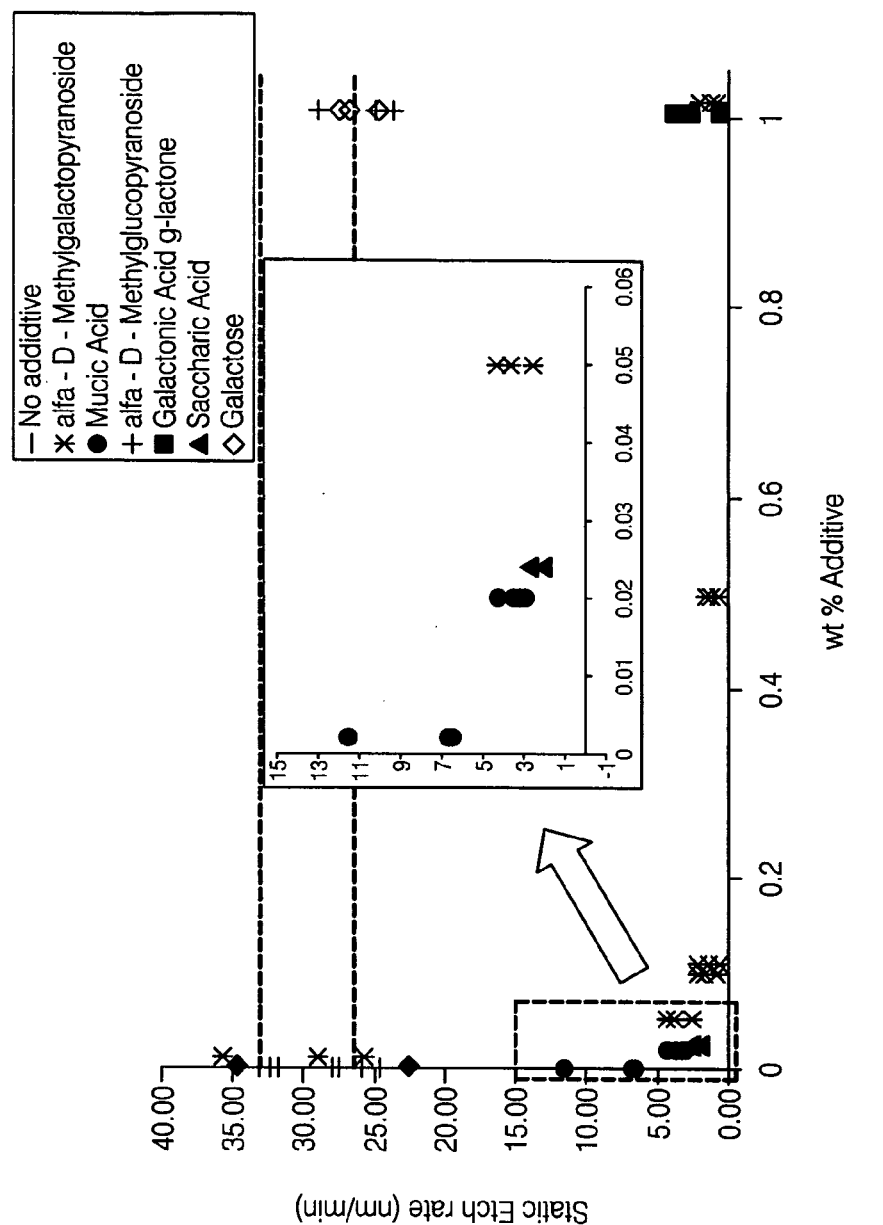
FIG. 11 shows static etch rate values of copper for solutions containing different sugar compounds. It is clear that derivatives of sugars such as saccharic acid (also known as glucaric acid) and mucic acid (also known as D-Galactaric acid) were more effective in decreasing the static etching of copper and thus exhibited higher corrosion inhibition characteristics.

Experiments performed with malic acid, which has two carboxylic groups and a carbon chain length of four, with citric acid, which has three carboxylic groups and a carbon chain length of five, or with acetic acid, which has one carboxylic group and a carbon chain length of one, show no effect on galvanic current (FIGS. 6 and 10).

Indeed, as shown in FIGS. 6 and 10, the galvanic current is below 3 μA for all the tested compositions of the preferred embodiments, including the compositions comprising the organic acids.

This low galvanic current (typically a few μA) is negligible compared to the galvanic current values obtained with $H_2O_2$-based slurries (typically more than 300 μA).

These low values indicate that the compositions comprising the organic acids do not give rise to galvanic corrosion of the W-containing barrier.

Some other preferred acids include polycarboxylic acids, such as those of the formula $HOOC-(CR_1R_2)_n-COOH$, wherein $R_1$ and $R_2$ are independently selected from the group consisting of hydrogen, alkyl, substituted alkyl, hydroxyl, ether, ester, and the like, and wherein n is an integer from 1 to 20, e.g., $HOOC-CH_2-CH(OH)-COOH$.

Any mono-, di-, tri-, and poly-carboxylic acids can be used. A composition of the preferred embodiments can comprise a single poly-carboxylic acid, or a mixture of two, three, or more of such organic acids.

In a composition of a preferred embodiment, the organic acid(s) is (are) "sugar acid(s)", i.e., carboxylic acids derived from sugar compounds. Examples of these carboxylic acids derived from sugar compounds include aldaric acid, alduronic acid, and aldonic acid derived from an aldosugar (or aldose) compound. For example, glucaric acid (an aldaric acid), gluconic acid (an aldonic acid), and glucuronic acid (an alduronic acid) are carboxylic acids derived from glucose.

The acids derived from sugars (more particularly, from monosaccharides) have high corrosion inhibition effects and are more particularly preferred compounds for compositions of the preferred embodiments.

Indeed, lower concentration of these "sugar acids" can be used to achieve the same corrosion inhibition as compared to the sugar compound itself from which they derive. These acids show a very high inhibition efficiency.

Preferred concentration ranges for $HNO_3$ when combined with "sugar acids" are from (about) 1.5 wt. % to (about) 5 wt. % based on the total weight of the composition. More preferably, $HNO_3$ concentration when combined with "sugar acids" is (about) 3 wt %, based on the total weight of the composition.

The preferred concentration ranges for "sugar acids" are from (about) 0.0001 wt. % and (about) 0.5 wt. % based on the total weight of the composition. More preferably, the "sugar acid(s)" concentration is (about) 0.05 wt. % based on the total weight of the composition.

In a preferred composition, the sugar is a monosaccharide.

Preferred monosaccharides include tetroses such as erythrose and threose; pentoses such as ribose, arabinose, xylose, lyxose; hexoses such as allose, altrose, glucose, mannose, gluose, idose, galactose, talose; and heptoses such as sedoheptulose.

The monosaccharides can be in ring or chain form, and in any isomeric form, such as the D isomer, the L isomer, or mixtures thereof.

Also suitable are amino-sugars and amino-saccharides, such as glucosamine. Other possible derivatives from sugars are the pyranosides, for example, methylpyranoside.

A slurry composition of the preferred embodiments can comprise a single sugar or sugar derivative, or a mixture of two, three or more of any of said sugars and/or sugar derivatives.

Preferred concentration ranges for the $HNO_3$ when combined with any of the sugars and/or sugar derivatives are from (about) 0.1 wt. % to (about) 3 wt. %, more preferably from (about) 0.5 wt. % to (about) 1 wt. %, based on the weight of the composition. And more preferably, the $HNO_3$ concentration is (about) 0.75 wt. %.

Preferred concentration ranges for the $HNO_3$ when combined with galactose and/or fructose are from (about) 0.1 wt. % to (about) 3 wt. %, more preferably from (about) 0.5 wt. % and (about) 1 wt. %, based on the weight of the composition. And more preferably, the $HNO_3$ concentration is (about) 0.75 wt. %.

Concerning sugar and/or sugar derivatives, preferred concentrations are in the range of from (about) 0.5 wt. % to (about) 15 wt. % sugar in solution, based on the weight of the composition.

In a composition of a preferred embodiment comprising galactose and/or fructose, the galactose concentration is (about) 1 wt. % and/or the fructose concentration is (about) 10 wt. % based on the total weight of the composition.

In FIG. 6, galvanic current values are shown using $HNO_3$-based slurries with fructose, glucose, and galactose additions. The very low galvanic current values do not give rise to galvanic corrosion of the W-containing barrier.

The amount of sugar compound added to the solution can be adjusted depending on the result to be achieved, and is a compromise between achieving an acceptable removal rate and acceptable corrosion inhibition.

A composition of the preferred embodiments can comprise a single sugar and/or organic acid, or a mixture of two, three or more of said sugars and/or organic acids.

Besides the organic compounds, other compounds can be added to compositions of the preferred embodiments to enhance the polishing process. An example of such an organic component is an alcohol, e.g., methanol. Experiments carried out with small additions of methanol (0.1 wt. %) to a solution containing $HNO_3$ and galactose showed increased inhibition efficiency due to the presence of methanol.

A composition of the preferred embodiments can be used in a chemical mechanical polishing process (CMP) for copper and WNC layer removal.

According to the preferred embodiments, a method for chemical mechanical polishing of copper integrated with W-containing barrier layers comprises the step of contacting the layers (both Cu and subsequently the W-containing layer) with a slurry composition comprising $HNO_3$ and at least one sugar compound and/or at least one organic acid.

In a method of the preferred embodiments, the W-containing barrier layer to be polished is a thin WNC barrier layer deposited by Atomic Layer Deposition. This thin barrier layer is deposited within semiconductor structures such as trenches before the deposition of copper to avoid diffusion of the copper into the insulator layer.

The WNC layers preferably have a thickness of from (about) 1 nm to (about) 20 nm, and more preferably of (about) 5 nm. The layers are very thin compared to the thickness of, e.g., currently used Ta(N) barriers deposited by Physical Vapor Deposition (PVD) and having a thickness of 20 to 200 nm.

A composition according to the preferred embodiments used to perform the polishing has a polishing or removal rate towards copper of (about) 30 nm copper removed per minute.

This is a rather slow polishing rate compared to the polishing rate of approximately 350 nm copper per minute obtained with commercially available slurries containing $H_2O_2$.

In order to obtain higher throughput values desired in commercial processing of semiconductor substrates, while still avoiding the galvanic corrosion of the W-containing layer, a sequential polishing method is preferred.

Figure 12:
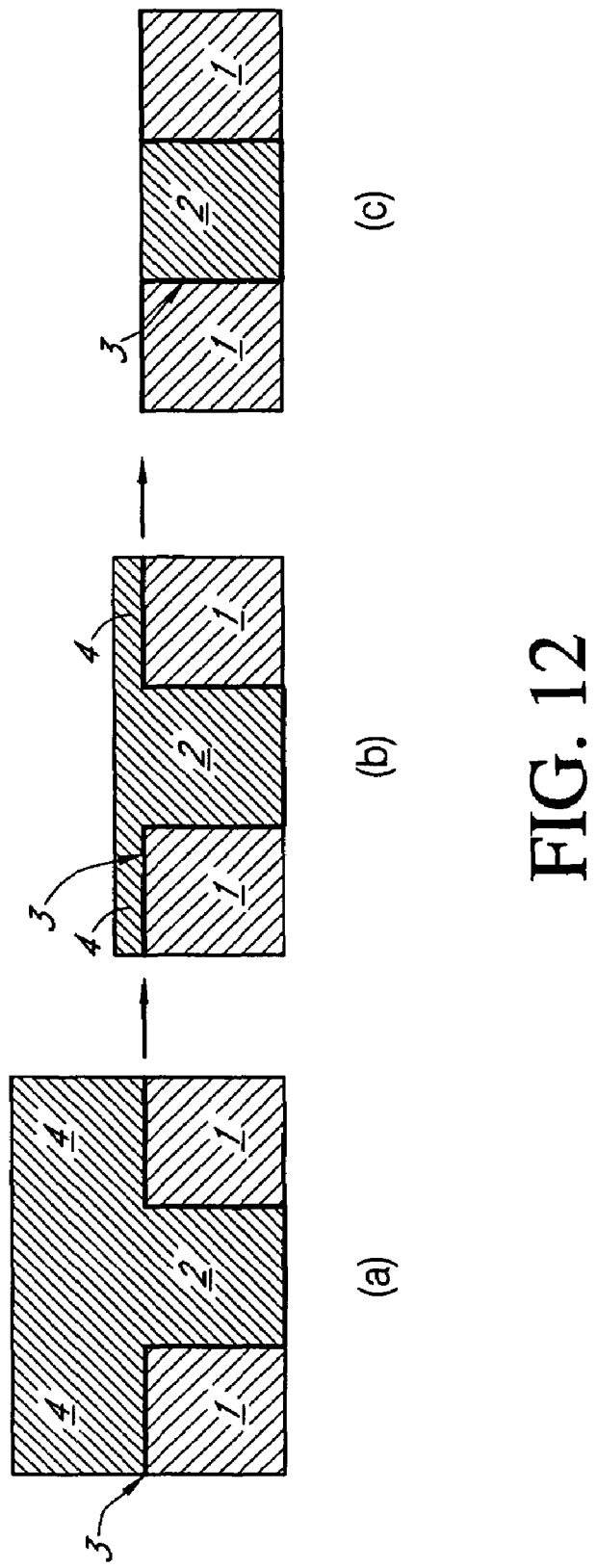
FIGS. 12 (a) to 12 (c) illustrate the two-step polishing method (CMP) of the preferred embodiments.

FIG. 12 illustrates the different steps of this polishing (CMP) method. FIG. 12 (a) shows a Cu damascene structure (comprising a copper structure 2 with a barrier layer 3 (e.g. WCN) in a dielectric material 1) before polishing (CMP) the Cu and WCN overburden. FIG. 12 (b) illustrates the resulting structure after the first polishing step using an $H_2O_2$ containing slurry and removing more than ¾ of the Cu overburden 4. FIG. 12 (c) illustrates the resulting structure after the second polishing step using the $HNO_3$-based slurry of a preferred embodiment removing the remaining overburden of Cu 4 and WCN barrier 3.

The two-step polishing method can comprise the steps of (as shown in FIG. 12 (a) to 12 (c)): substantially removing the copper overburden 4 by means of a $H_2O_2$-containing slurry composition; and then removing the remaining overburden of copper 4 and WCN barrier layer 3 by means of a slurry composition of a preferred embodiment comprising at least one sugar compound and/or at least one organic acid in addition of $HNO_3$.

With this two-step method, a satisfactory Cu removal rate is obtained in the first step and W dissolution within the structure due to galvanic corrosion is avoided by a second polishing step using a slurry composition according to the preferred embodiments.

The term "substantially" used in a method of the preferred embodiments refers to the removal, in the first polishing step, of more than 50%, preferably more than 75% (or ¾), more preferably more than 80%, 85%, or 90% (and less than 100%) of the total amount of copper overburden 4. Even more preferably, from about 90% to about 95% of the total amount of copper overburden 4 is removed.

As an example, if the copper overburden to be removed is 1 μm, the amount of copper overburden removed in the first step is preferably more than 750 nm (up to (about) 1 nm) and more preferably about 900 nm.

In the second polishing step, the remaining copper overburden and the remaining W containing barrier overburden (e.g. WNC, generally in the order of 5 nm) are removed.

In a method of a preferred embodiment, in a first polishing step, the excess amount of copper is polished with a slurry having a high efficiency and removal rate towards copper. These slurries contain $H_2O_2$ as the oxidizing compound and are commercially available.

The thickness of the layer to be removed in this first polishing step is preferably from (about) 500 nm to (about) 1000 nm, depending on technology node.

Special care is taken such that the polishing is stopped before the W-containing barrier is reached. A copper layer of preferably less than (about) 100 nm and more preferably from (about) 1 nm to (about) 75 nm thickness can remain on the W-containing barrier after the first polishing step to protect the W-containing barrier (e.g. WNC layer) from galvanic corrosion by $H_2O_2$.

In a method of a preferred embodiment, in a second and much slower polishing step performed with a slurry composition according to the preferred embodiments, the remaining copper overburden and remaining W barrier overburden (e.g., WNC layer underneath the Cu overburden) are removed.

The second polishing step prevents galvanic corrosion of the barrier and makes integration of the W-containing barrier in semiconductor processing possible.

Besides the prevention of galvanic corrosion, a slurry composition and a method of the preferred embodiments have the advantage of avoiding the spontaneous addition of chemically unstable oxidizers such as peroxide (more specifically, $H_2O_2$) and peroxo compounds to the slurry, which is time-consuming and can cause contamination problems. Indeed, the peroxide ($H_2O_2$) cannot be added to the slurry a long time before use because of its short lifetime in the slurry.

EXAMPLES

Example 1

Galvanic Current Experiments

2×7 $cm^2$ Cu and WNC (deposited on a blanket Si-wafer) samples were used with a 2×2 $cm^2$ area of exposure. Cu was deposited by electrochemical plating (ECP) with an underlying 150 nm Cu seed layer. A 60 nm thick WNC was deposited by ALD on 500 nm thick $SiO_2$. The Cu and WCN samples were electrically contacted to each other through a digital multimeter and dipped respectively in: a $H_2O_2$ based slurry, malic acid contained in a 9 vol. % $H_2O_2$ solution, citric acid contained in a 9 vol. % $H_2O_2$ solution, and a nitric acid based slurry (without further additions).

In solutions containing $H_2O_2$, the $H_2O_2$ was added just prior to experimentation to suppress the decomposition of $H_2O_2$.

The galvanic current was measured simultaneously by using a Keithley 195 A digital multimeter that was connected to the galvanic couple Cu/WCN. The results are summarized in FIG. 1, which shows the galvanic current change as a function of dip time for the Cu—WNC galvanic couple.

The higher galvanic current values were obtained by the commercial slurry ($H_2O_2$-based solution) and the lowest current values were obtained with an $HNO_3$-based solution (without further addition of an organic compound).

$H_2O_2$ based solutions containing, respectively, additions of citric acid and malic acid also showed high galvanic current values.

The initial instability in current was attributed to the initial condition of the surface.

It can be inferred that an $HNO_3$-based solution prevented the galvanic corrosion of the WNC barrier layer.

Example 2

WCN Loss by Chemical Dip and Galvanic Coupling

The WNC loss was measured after a Cu/WNC galvanic couple (as described in Example 1) was contacted (by dipping in the solution), respectively, to a $H_2O_2$ based slurry, malic acid contained in a 9 vol. % $H_2O_2$ solution, and citric acid contained in a 9 vol. % $H_2O_2$ solution.

In parallel, the WNC barrier layer sample was dipped in the same three solutions (referred to as chemical only dip), and the WNC loss was also measured as a function of time.

Figure 2:
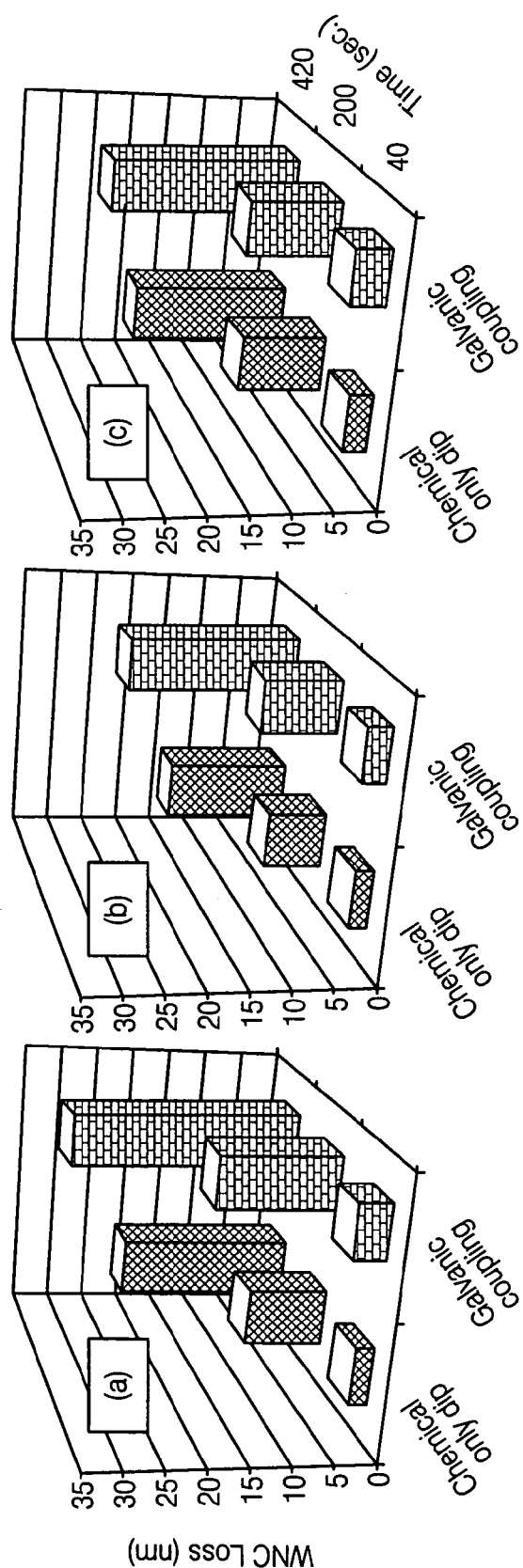
FIG. 2 shows a comparison of WNC etch rate between a chemical only dip and galvanic coupling to Cu using an $H_2O_2$ based commercial slurry (a), a citric acid solution containing 9 vol. % $H_2O_2$ (b), and a malic acid solution containing 9 vol. % $H_2O_2$ (c). It is shown that galvanic coupling gave rise to higher etch rate values for all solutions. However, a commercially available $H_2O_2$-based slurry revealed higher etch rates compared to the $H_2O_2$ solution containing citric acid or malic acid.

The results are summarized in FIG. 2, which highlights the comparison between the WNC etch rate in the framework of chemical dip and the WNC etch rate in the framework of galvanic coupling to Cu, for each of the solutions tested.

It is shown that galvanic coupling gave rise to higher etch rate values for the three solutions. However, the commercial slurry exhibited higher etch rates when compared to the $H_2O_2$-based solutions containing citric acid or malic acid.

The addition of organic acids to the $H_2O_2$ solution could not, however, avoid galvanic coupling.

In comparison, the WNC etch rate, both after chemical only dip and galvanic coupling to Cu, in a slurry composition of a preferred embodiment comprising nitric acid ($HNO_3$) and acetic acid, was lower than 1 nm/min. In other words, the WNC loss was less than 7 nm after 420 seconds.

Example 3

Galvanic Etching Experiments

Cu and WNC samples were prepared and used, respectively, as positive and negative electrodes which were connected through a digital multimeter to measure voltage variation during galvanic coupling experiments. During these experiments, the Cu and WNC "electrodes" were contacted, respectively, with a $H_2O_2$ based slurry, malic acid contained in a 9 vol. % $H_2O_2$ solution, citric acid contained in a 9 vol. % $H_2O_2$ solution, and a $HNO_3$-based solution.

Figure 3:
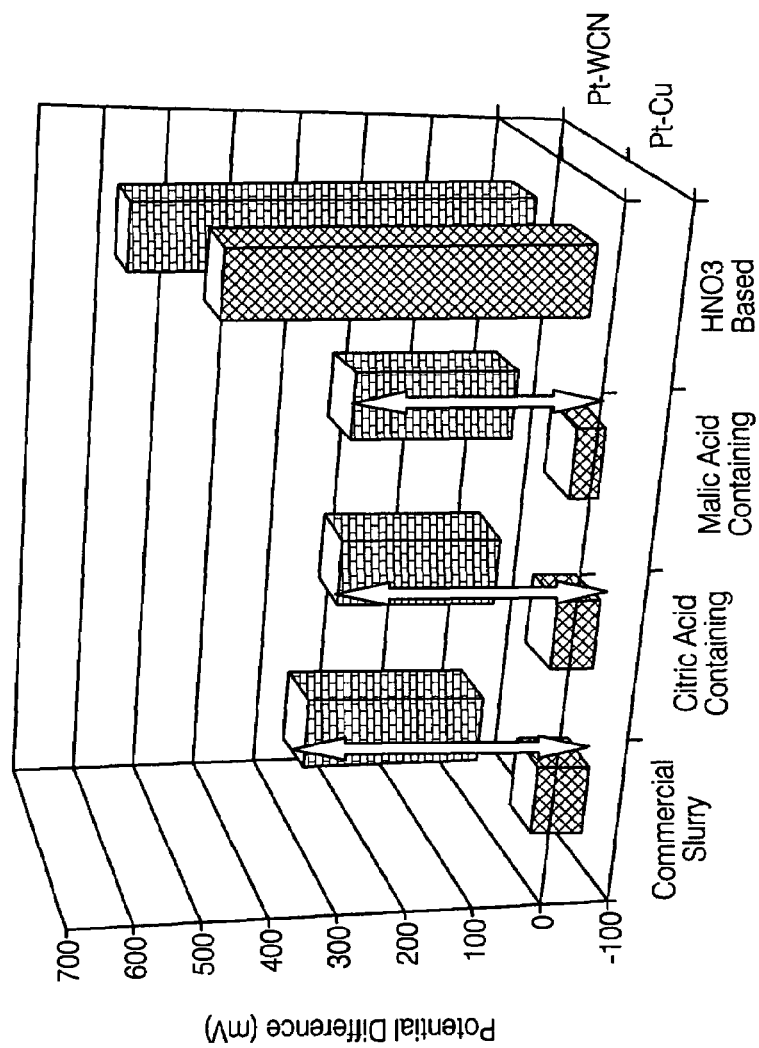
FIG. 3 shows the potential difference against a reference Pt electrode for Cu and WNC in different solutions. The larger the difference between Pt—Cu and Pt—WNC, the more likely it was that WNC and Cu would suffer from galvanic corrosion when they were brought together in such solutions. The solutions tested here included an $H_2O_2$ based commercial slurry, a citric acid solution containing 9 vol. % $H_2O_2$, a malic acid solution containing 9 vol. % $H_2O_2$, and an $HNO_3$-based solution. In this respect, the $HNO_3$-based solution gave the lowest potential difference.

FIG. 3 summarizes the results obtained, showing the potential difference against reference Pt electrode for Cu and WNC for each solution. The larger the difference was between Pt—Cu and Pt—WNC, the more likely it was that WNC and Cu would suffer from galvanic corrosion when they were brought together in such solutions.

Indeed, the enhancement in etching because of galvanic coupling to Cu arose from the high potential difference between WNC and Cu in these solutions (FIG. 2).

In this respect, the $HNO_3$-based solution gave the lowest potential difference (FIG. 3). This is in agreement with the WNC etch rate value for the $HNO_3$-based solution, which is about 1 nm/min.

Figure 1:
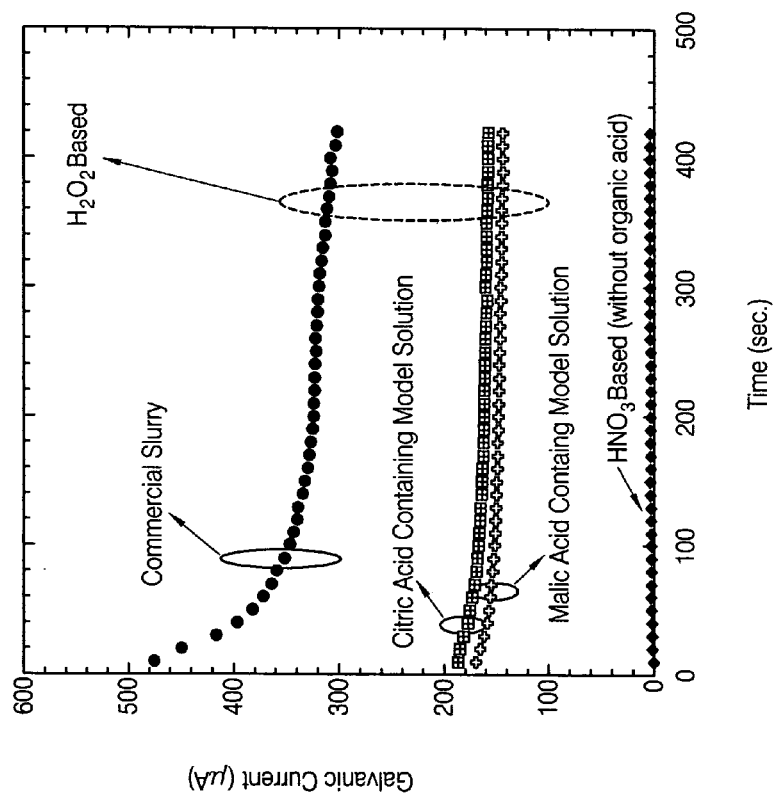
FIG. 1 shows the galvanic current change as a function of dip time for a Cu—WNC galvanic couple. Higher galvanic current values were observed for the $H_2O_2$ based slurry (commercially available slurry).

Referring to FIGS. 1 and 3, citric acid-containing solution resulted in a lower current change when compared to the commercial slurry. This showed that WNC was subject to more anodic oxidation by the commercial slurry, thus resulting in more loss of W after galvanic coupling to Cu.

In parallel, the same measurements were made using a commercial slurry ($H_2O_2$-based solution), a 9 vol. % $H_2O_2$-based solution to which malic acid (e.g. 0.05 wt. %) was added, a $HNO_3$-based solution (with no $H_2O_2$), a slurry composition of a preferred embodiment comprising $HNO_3$ (3 wt. %) and citric acid (0.05 wt. %), a slurry composition of a preferred embodiment comprising $HNO_3$ (3 wt. %) and malic acid (0.05 wt. %), and a slurry composition of a preferred embodiment comprising $HNO_3$ (0.75 wt. %) and fructose (10 wt. %).

Figure 7:
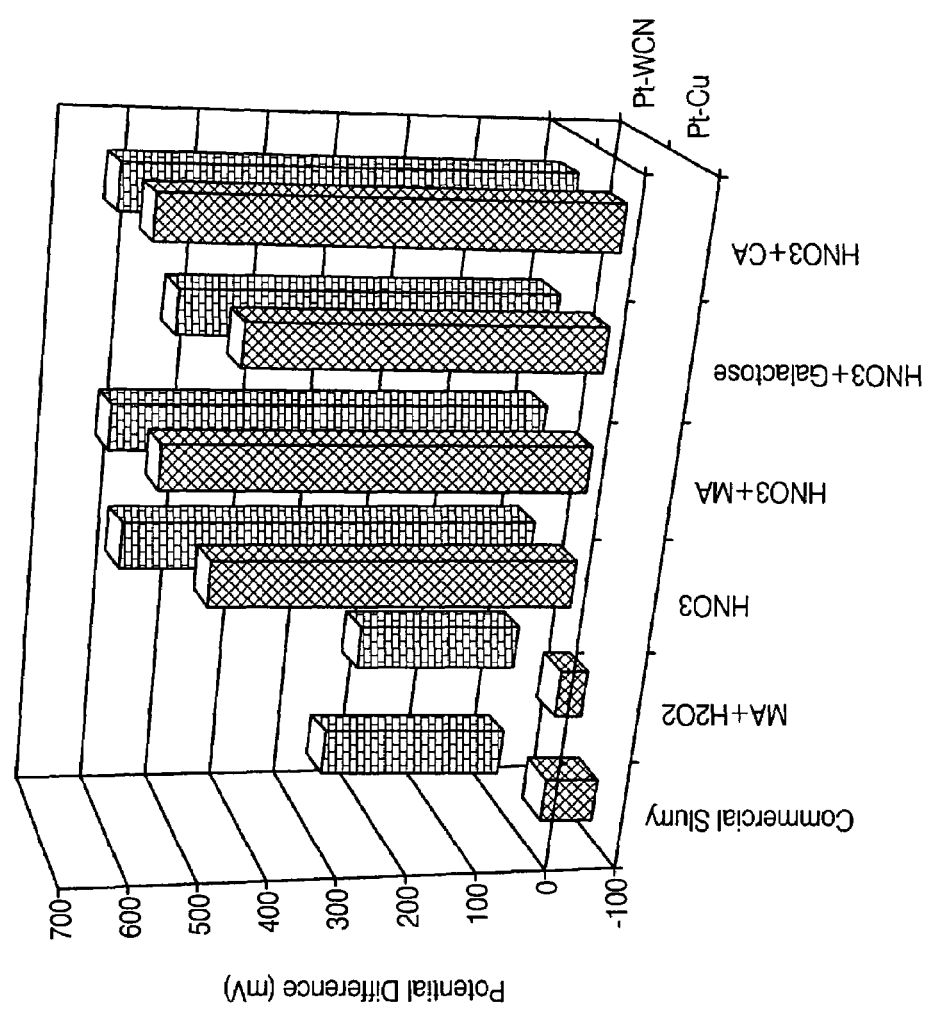
FIG. 7 shows potential difference against a Pt electrode by using different slurry compositions.

The results are summarized in FIG. 7. There was very little potential difference between the W-containing barrier and Cu in the slurry compositions of the preferred embodiments in comparison to the potential differences observed with the other slurry solutions tested ($H_2O_2$-based).

Moreover, the potential differences observed with the slurry compositions of the preferred embodiments were such that no galvanic corrosion was likely to occur.

Example 4

Polishing Experiments

Different Cu damascene structures with either a WNC barrier layer or a Ta(N) barrier layer were polished using different polishing slurries and TEM (Transmission Electron Microscopy) or SEM (Scanning Electron Microscopy) images were taken in order to observe the effect of the different polishing slurries used.

Figure 4:
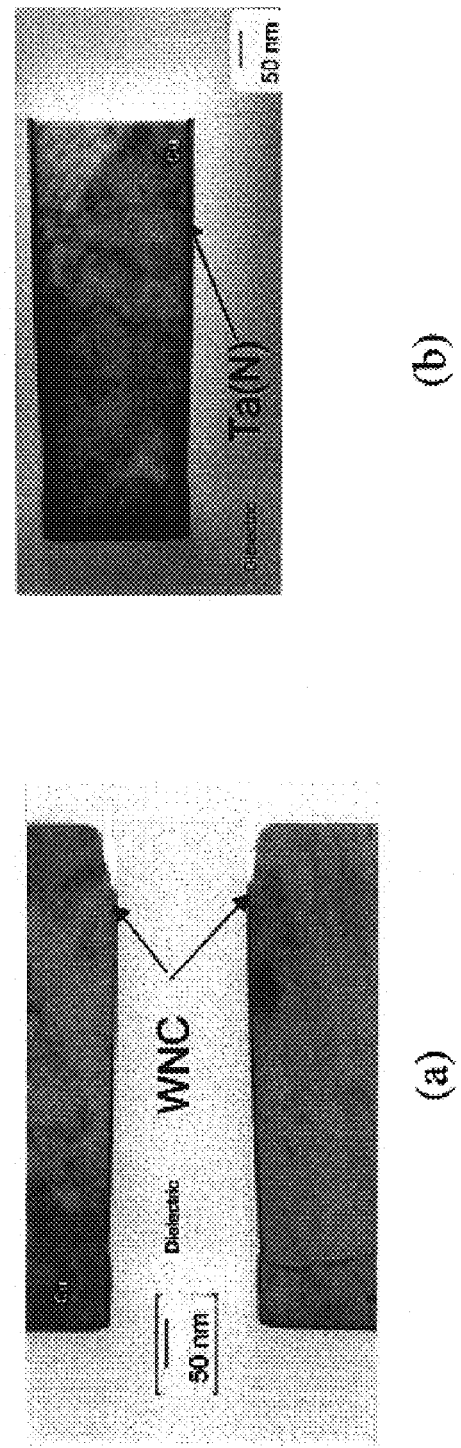
FIG. 4 shows TEM images of (a) Cu damascene structures with a WNC barrier layer and (b) Cu damascene structures with a TaN barrier layer, wherein both structures were polished using a polishing slurry with peroxide (here, $H_2O_2$) as etchant. There was a loss of WNC on the top corners of the trenches at the interface between WNC and Cu, and no Ta loss was observed after polishing with $H_2O_2$, which means that there was no galvanic corrosion effect in the Cu structure with Ta(N)-containing barriers.
Figure 5:
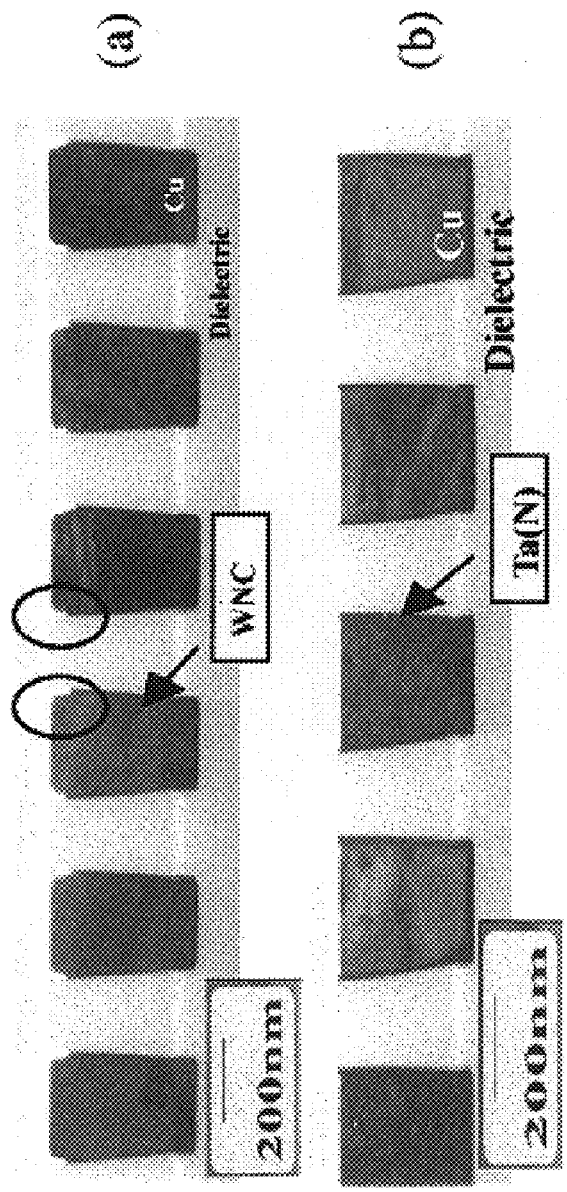
FIG. 5 shows TEM images of (a) Cu damascene structures with a WNC barrier layer and (b) Cu damascene structures with a Ta(N) barrier layer, wherein both structures were polished by using a polishing slurry with $H_2O_2$ as etchant. There was a loss of WNC on the top corners of the trenches at the interface between WNC and Cu but there was no Ta loss observed after polishing with $H_2O_2$, which means that there was no galvanic corrosion effect in the Cu structure with Ta(N) containing barriers.

The first Cu damascene structure tested had a WNC barrier layer and was polished with a $H_2O_2$-based solution (Hitachi slurry C430-A18). The result is shown in FIG. 4 (a). A loss of WNC was noticed on the top corners of the trenches at the interface between WNC and Cu.

Another Cu damascene structure with a Ta(N) barrier layer was polished with a $H_2O_2$ based solution (Hitachi slurry C430-A18). The result is shown in FIG. 4 (b). No loss of Ta(N) was noticed after polishing, which meant that there was no galvanic corrosion effect in the Cu structure with Ta(N)-containing barrier.

Different Cu damascene structures with a WNC barrier layer were polished on a polishing tool (Megapol) with a slurry composition of a preferred embodiment comprising $HNO_3$ and malic acid. The slurry composition also comprised silica particles.

Figure 8:
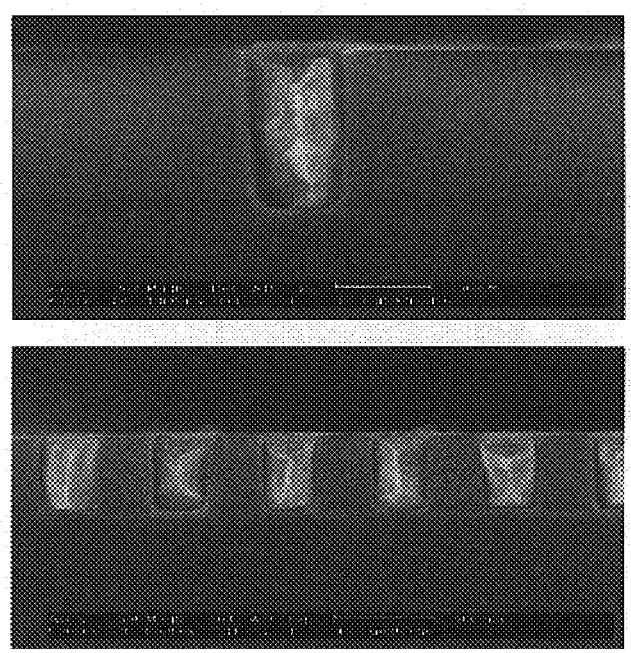
FIG. 8 shows cross section SEM images after polishing Cu structures with integrated WNC barrier layers using an $HNO_3$ based slurry with malic acid in a 0.2 μm isolated copper line and in 0.2 μm semi-dense lines.
Figure 9:
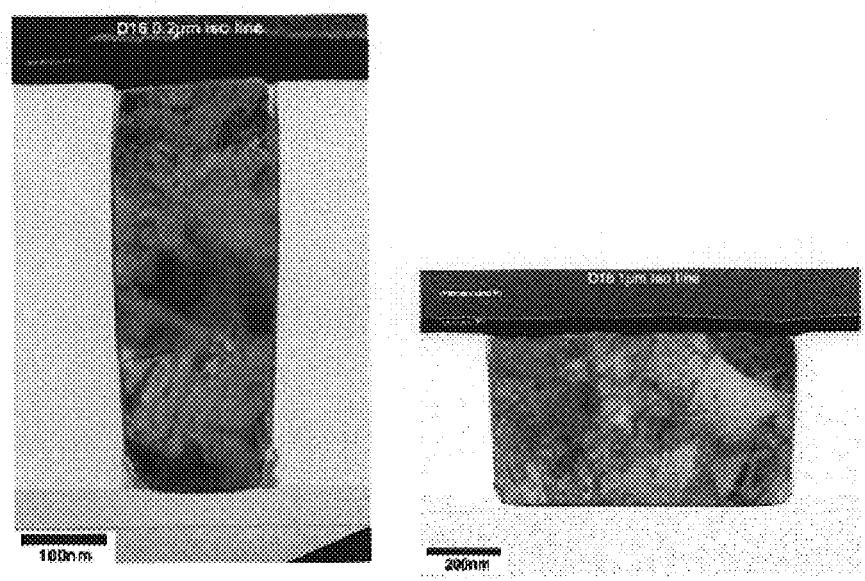
FIG. 9 shows cross section TEM images after polishing using a $HNO_3$ based slurry with malic acid in a 0.2 μm isolated copper line (left side) and in a 1.0 μm isolated copper line (right side)

The results are shown in FIG. 8, representing cross section SEM images, and in FIG. 9 representing cross section TEM images. No loss of WNC was noticed after polishing, which meant that there was no galvanic corrosion effect generated by a slurry composition of a preferred embodiment comprising $HNO_3$ and malic acid in the Cu structure with WNC containing barrier.

Example 5

Galvanic Current Experiments

Cu and WNC samples as described in Example 1 were used with a 2×2 cm² area of exposure. The Cu and WCN samples were electrically contacted to each other through a digital multimeter and dipped respectively in a $H_2O_2$-based solution, a slurry composition of a preferred embodiment comprising $HNO_3$ (3 wt. %, and no $H_2O_2$), a slurry composition of a preferred embodiment comprising $HNO_3$ (3 wt. %) and citric acid (0.05 wt. %), a slurry composition of a preferred embodiment comprising $HNO_3$ (3 wt. %) and malic acid (0.05 wt. %), a slurry composition of a preferred embodiment comprising $HNO_3$ (0.75 wt. %) and fructose (10 wt. %), a slurry composition of a preferred embodiment comprising $HNO_3$ (0.75 wt. %) and galactose (1 wt. %), a slurry composition of a preferred embodiment comprising $HNO_3$ (0.75 wt. %) and glucose (0.05 wt. %).

The results are summarized in FIG. 6 and FIG. 10, which show the galvanic current change as a function of time for the Cu—WNC galvanic couple.

The higher galvanic current values were obtained with a $H_2O_2$-based slurry solution (FIG. 10).

The current values obtained with a composition of the preferred embodiments corresponded to a very small current flow. This meant that there was little potential difference built up between the W-containing barrier and Cu in the compositions of the preferred embodiments such that no galvanic corrosion was likely to occur.

This is confirmed by the results represented in FIG. 7. The potential difference appeared to be high for the $H_2O_2$-based solution in comparison with the potential differences measured with $HNO_3$-based solutions, in particular with a slurry composition comprising $HNO_3$ and malic acid or with a slurry composition comprising $HNO_3$ and galactose.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A slurry composition for polishing of copper, wherein the copper is integrated with a tungsten-containing barrier layer, the composition comprising from about 1.5 wt. % to about 5.0 wt. % $HNO_3$, from about 0.00001 wt. % to about 0.5 wt. % of an organic acid, and no $H_2O_2$, wherein the organic acid is an oxidized sugar compound, and wherein the oxidized sugar compound is aldaric acid.

2. The composition according to claim 1, wherein a concentration of the $HNO_3$ is about 3 wt. %, based on a total weight of the composition.

3. The composition according to claim 2, comprising about 0.5 wt. % of the organic acid.

4. The composition according to claim 1, further comprising methanol, wherein a concentration of the methanol is about 0.1 wt. %, based on a total weight of the composition.

5. The composition according to claim 1, wherein the composition exhibits low or negligible galvanic current for a Cu—WNC galvanic couple.

6. The composition according to claim 1, wherein the composition removes copper at a rate of about 30 nm per minute.

7. The composition according to claim 1, wherein the composition exhibits a WNC etch rate of about 1 nm per minute.

8. The composition according to claim 1, further comprising abrasive particles.

9. The composition according to claim 8, wherein the abrasive particles are metal oxide particles.

10. The composition according to claim 9, wherein the metal oxide particles are colloidal silica particles.

11. The composition according to claim 9, wherein the metal oxide particles are alumina particles.

12. A slurry composition for polishing of copper, wherein the copper is integrated with a tungsten-containing barrier layer, the composition comprising from about 1.5 wt. % to about 5.0 wt. % $HNO_3$, from about 0.00001 wt. % to about 0.5 wt. % of an organic acid, and no $H_2O_2$, wherein the organic acid is an oxidized sugar compound, and wherein the oxidized sugar compound is alduronic acid.

13. The composition according to claim 12, wherein a concentration of the $HNO_3$ is about 3 wt. %, based on a total weight of the composition.

14. The composition according to claim 13, comprising about 0.5 wt. % of the organic acid.

15. The composition according to claim 12, further comprising methanol, wherein a concentration of the methanol is about 0.1 wt. %, based on a total weight of the composition.

16. The composition according to claim 12, wherein the composition exhibits low or negligible galvanic current for a Cu—WNC galvanic couple.

17. The composition according to claim 12, wherein the composition removes copper at a rate of about 30 nm per minute.

18. The composition according to claim 12, wherein the composition exhibits a WNC etch rate of about 1 nm per minute.

19. The composition according to claim 12, further comprising abrasive particles.

20. The composition according to claim 19, wherein the abrasive particles are metal oxide particles.

21. The composition according to claim 20, wherein the metal oxide particles are colloidal silica particles.

22. The composition according to claim 20, wherein the metal oxide particles are alumina particles.

23. A slurry composition for polishing of copper, wherein the copper is integrated with a tungsten-containing barrier layer, the composition comprising from about 1.5 wt. % to about 5.0 wt. % $HNO_3$, from about 0.00001 wt. % to about 0.5 wt. % of an organic acid, and no $H_2O_2$, wherein the organic acid is an oxidized sugar compound, and wherein the oxidized sugar compound is aldonic acid.

24. The composition according to claim 23, wherein a concentration of the $HNO_3$ is about 3 wt. %, based on a total weight of the composition.

25. The composition according to claim 24, comprising about 0.5 wt. % of the organic acid.

26. The composition according to claim 23, further comprising methanol, wherein a concentration of the methanol is about 0.1 wt. %, based on a total weight of the composition.

27. The composition according to claim 23, wherein the composition exhibits low or negligible galvanic current for a Cu—WNC galvanic couple.

28. The composition according to claim 23, wherein the composition removes copper at a rate of about 30 nm per minute.

29. The composition according to claim 23, wherein the composition exhibits a WNC etch rate of about 1 nm per minute.

30. The composition according to claim 23, further comprising abrasive particles.

31. The composition according to claim 30, wherein the abrasive particles are metal oxide particles.

32. The composition according to claim 31, wherein the metal oxide particles are colloidal silica particles.

33. The composition according to claim 31, wherein the metal oxide particles are alumina particles.

* * * * *

UNITED STATES PATENT AND TRADEMARK OFFICE
CERTIFICATE OF CORRECTION

PATENT NO. : 7,589,052 B2   Page 1 of 1
APPLICATION NO. : 11/181565
DATED : September 15, 2009
INVENTOR(S) : Ernur et al.

It is certified that error appears in the above-identified patent and that said Letters Patent is hereby corrected as shown below:

| Issued Patent | | 1. | Description of Error |
|---|---|---|---|
| Column | Line | | |
| 4 | 62 | | Change "side)" to --side).--. |
| 6 | 67 | | Change "methylpyranoside" to --methyl pyranoside--. |

Signed and Sealed this

Thirteenth Day of April, 2010

David J. Kappos
*Director of the United States Patent and Trademark Office*

UNITED STATES PATENT AND TRADEMARK OFFICE
CERTIFICATE OF CORRECTION

PATENT NO. : 7,589,052 B2
APPLICATION NO. : 11/181565
DATED : September 15, 2009
INVENTOR(S) : Ernur et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1015 days.

Signed and Sealed this

Twenty-first Day of September, 2010

David J. Kappos
*Director of the United States Patent and Trademark Office*